United States Patent
Uesaka et al.

(10) Patent No.: US 9,819,149 B2
(45) Date of Patent: Nov. 14, 2017

(54) OPTICAL TRANSMITTER IMPLEMENTING WAVELENGTH TUNABLE DIODE

(71) Applicants: Sumitomo Electric Industries, Ltd., Osaka-shi (JP); NATIONAL INSTITUTE OF ADVANCED INDUSTRIAL SCIENCE AND TECHNOLOGY, Tokyo (JP)

(72) Inventors: Katsumi Uesaka, Yokohama (JP); Haruhiko Kuwatsuka, Tsukuba (JP); Aaron Albores-Mejia, Tsukuba (JP)

(73) Assignees: Sumitomo Electrix Industries, Ltd., Osaka-shi (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 15/357,620

(22) Filed: Nov. 21, 2016

(65) Prior Publication Data

US 2017/0149209 A1 May 25, 2017

(30) Foreign Application Priority Data

Nov. 24, 2015 (JP) .................................. 2015-229036
Nov. 14, 2016 (JP) .................................. 2016-221846

(51) Int. Cl.

| H01S 5/06 | (2006.01) |
|---|---|
| H01S 5/0687 | (2006.01) |
| H01S 5/068 | (2006.01) |
| H01S 5/125 | (2006.01) |
| H01S 5/12 | (2006.01) |

(52) U.S. Cl.
CPC ........ *H01S 5/0687* (2013.01); *H01S 5/06817* (2013.01); *H01S 5/125* (2013.01); *H01S 5/1212* (2013.01)

(58) Field of Classification Search
None
See application file for complete search history.

(56) References Cited

PUBLICATIONS

Aoyama et al., "Optical Negative Feedback for Linewidth Reduction of Semiconductor Lasers," IEEE Photonics Technology Letters, vol. 27, No. 4, pp. 340-343, Feb. 15, 2015.
Sivananthan et al., "Integrated Linewidth Reduction of a Tunable SG-DBR Laser," CLEO2013, CTu1L.2, 2013.
Yasaka et al., "FM Noise and Spectral Linewidth Reduction by Incoherent Optical Negative Feedback," IEEE Journal of Quantum Electronics, vol. 27, No. 2, pp. 193-204, Feb. 1991.

*Primary Examiner* — Armando Rodriguez
(74) *Attorney, Agent, or Firm* — Venable LLP; Michael A. Sartori; Laura G. Remus

(57) ABSTRACT

An optical transmitter that includes a wavelength tunable laser diode (LD) with a narrowed emission linewidth is disclosed. The optical transmitter further includes a feedback unit and an optical attenuator. The feedback unit, receiving a portion of laser light of the wavelength tunable LD, generates feedback light by rotating the polarization of the laser light by 90±5°, and returns thus generated feedback light in the wavelength tunable LD. The optical attenuator adjusts power of the feedback light to reduce a line wide of the laser light, or frequency noises thereof.

15 Claims, 14 Drawing Sheets

OPTICAL TRANSMITTER IMPLEMENTING WAVELENGTH TUNABLE DIODE

CROSS-REFERENCE TO RELATED APPLICATION

This application is based upon and claims the benefit of priority of the prior Japanese Patent Application No. 2015-229036, filed on Nov. 24, 2015, and the prior Japanese Patent Application No. 2016-221846, filed on Nov. 14, 2016, the entire contents of which are incorporated herein by reference.

BACKGROUND OF THE INVENTION

1. Field of the Invention

The present invention relates to an optical transmitter that implements a wavelength tunable laser diode (wavelength tunable LD) and a method of controlling the same.

2. Background Arts

Various prior documents has disclosed techniques for reducing frequency noises inherently contained in laser light output from a semiconductor laser diode (wavelength tunable LD), which is equivalently to reduce a linewidth of the laser light. One of such techniques re-enters a portion of the laser light into a cavity of the wavelength tunable LD by reflecting the laser light out of the wavelength tunable LD. Another technique feeds an output of a wavelength dependence filter that transmits the laser light back to a current for adjusting a phase of the laser light to decrease the linewidth of the laser light. Still another technique re-enters a portion of the laser light into the cavity after rotating the polarization of the laser light.

SUMMARY OF THE INVENTION

One aspect of the present application relates to an optical transmitter that comprises a wavelength tunable laser diode (LD), a feedback unit, and an optical attenuator. The wavelength tunable LD emits laser light with a polarization. The feedback unit generates feedback light by rotating the polarization of a portion of the laser light by a range of 90±5° and returns the feedback light to the wavelength tunable LD. The optical attenuator controls power of the feedback light. The feedback light may reduce frequency noises attributed to the laser light.

Another aspect of the present application relates to a method of controlling a wavelength tunable LD. The method includes steps of: (a) extracting a portion of laser light output from the wavelength tunable LD, where the portion of the laser light has a polarization; (b) generating feedback light by rotating the polarization of the portion of the laser light by a range of 90±5°; and (c) returning the feedback light to the wavelength tunable LD as adjusting power thereof such that the laser light reduces frequency noises.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment of the present invention will be described as referring to accompanying drawings. In the description of the drawings, numerals or symbols same with or similar to each other will refer to elements same with or similar to each other without duplicating explanations.

First Embodiment

Figure 1:
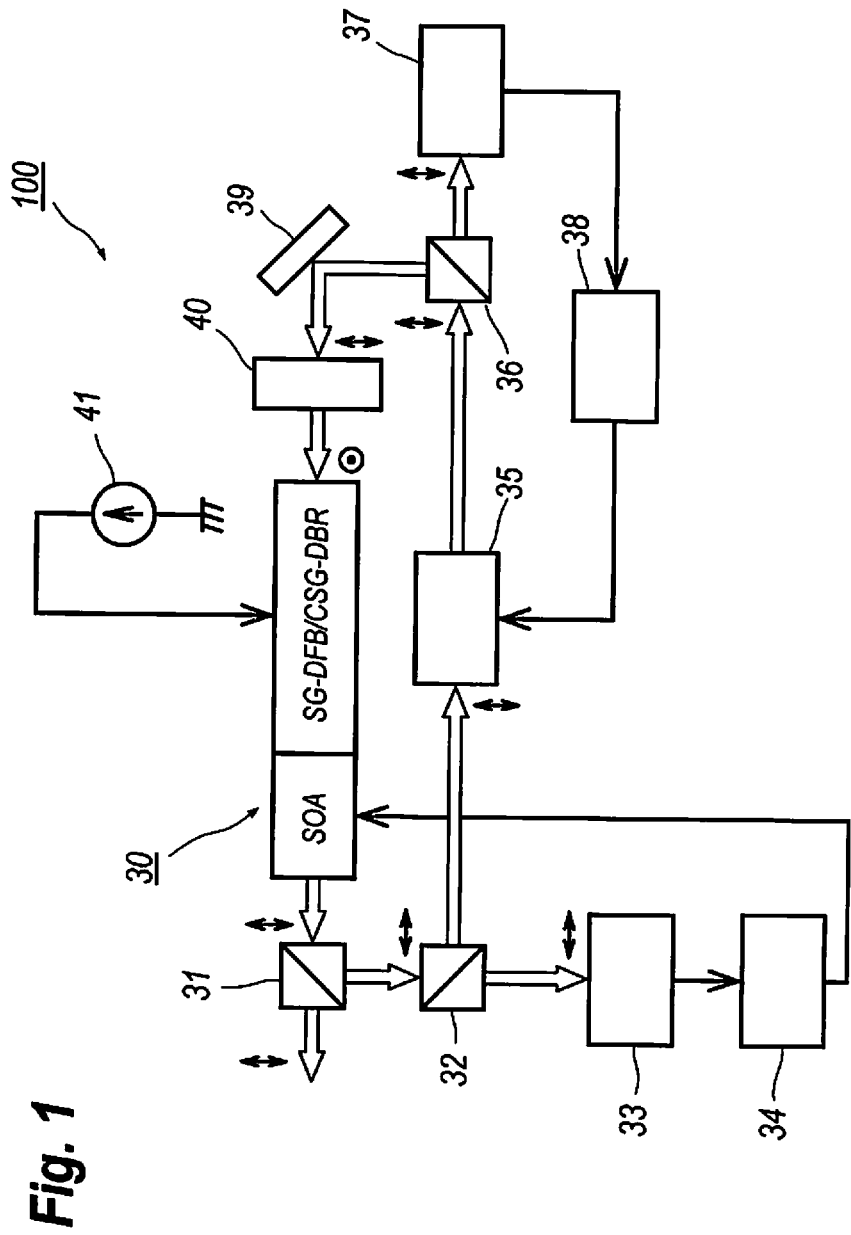
FIG. 1 schematically illustrates a functional block diagram of a wavelength tunable optical transmitter according to the first embodiment of the present invention.

FIG. 1 is a plan view schematically illustrating a functional block diagram of a wavelength tunable optical transmitter 100 according to the first embodiment of the present invention. The optical transmitter 100 includes a wavelength tunable laser diode (LID) 30 as an optical source. The wavelength tunable LD 30 of the present embodiment monolithically integrates a semiconductor optical amplifier (SOA) with a laser cavity. The SOA may adjust output power of the wavelength tunable LD 30, that is, the SOA may not only increase the optical output power of the wavelength tunable LD 30 but also attenuate the output power, or sometimes set the output power thereof to be substantially zero. The wavelength tunable LD 30 may be enclosed within a package.

Figure 2:
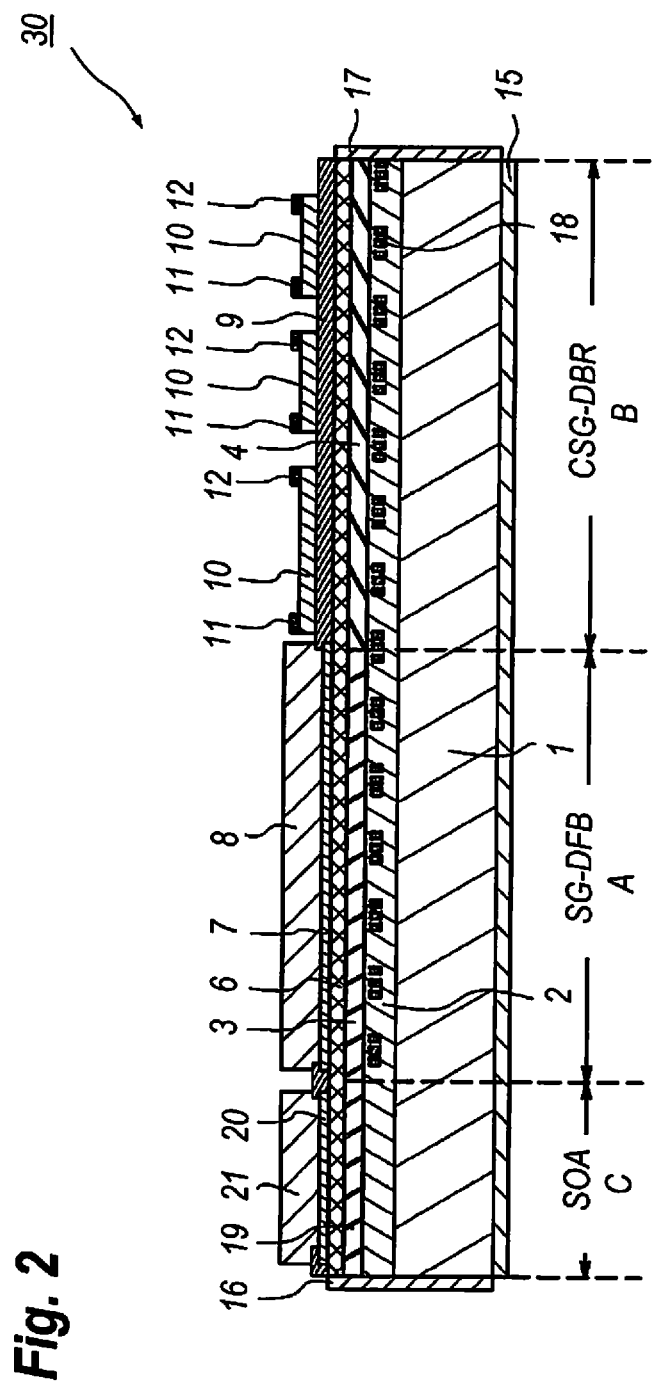
FIG. 2 schematically shows a cross section of a wavelength tunable laser diode.

The optical transmitter 100 further includes optical splitters, 31, 32, and 36, a mirror 39, a half-wave plate (λ/2 plate) 40, photo-detectors, 33 and 37, a variable optical attenuator (VOA) 35, and two power controllers, 34 and 38. FIG. 2 schematically illustrates a side cross section of the wavelength tunable LD 30 of the present embodiment. The wavelength tunable LD 30 provides regions A to C arranged sequentially along an optical axis of the wavelength tunable LD 30. The region A includes a sampled grating distributed feedback (SG-DFB) that shows a substantial optical gain, the region B includes a chirped sampled grating distributed Bragg reflector (CSG-DBR) that shows no optical gain but a specific reflectivity with periodic peaks, and the region C includes the SOA. The SG-DFB and the CSG-DBR constitutes the cavity for the laser oscillation of the wavelength tunable LD 30 and determines a wavelength of the laser light output therefrom.

The SG-DFB region A provides a semiconductor stack on a substrate 1, where the semiconductor stack includes, from the side of the substrate 1, a lower cladding layer 2, an active layer 3, an upper cladding layer 6, and a contact layer 7. The contact layer 7 provides an electrode 8 thereon. The CSG-DBR region B includes another semiconductor stack on the substrate 1, where the other semiconductor stack includes the lower cladding layer 2, an optical waveguide layer 4, and the upper cladding layer. Provided on the upper cladding layer 6 is a heater 10 through an insulating film 9. The heaters 10 each accompanies with a supply electrode 11 and a ground electrode 12. The SOA region C also provides a still another semiconductor stack on the substrate 1, where the still another semiconductor stack has the lower cladding layer 2, an amplifying layer 19, the upper cladding layer 6, and a contact layer 20. The contact layer 20 in the SOA region C provides another electrode 21 thereon, which is electrically isolated from the electrode 8 in the SG-DFB region A. Thus, the regions, A to C, commonly provide the lower cladding layer 2 and the upper cladding layer 6; but the active layer 3 in the SG-DFB region A, the optical waveguide layer 4 in the CSG-DBR region B, and the amplifying layer 19 in the SOA region C are independent to each other with evenly formed bottom levels thereof. That is, the top level of the lower cladding layer 2 are even in the regions, A to C. The active layer 3 in the SG-DFB region forms a boundary against the waveguide layer 4 in the CSG-DBR region, which is identical with the boundary between the SG-DFB region A and the CSG-DBR region B.

The SOA region C in an end opposite to the SG-DFB region A provides a facet 16 with a film that covers edges of the substrate 1, the lower cladding layer 2, the amplifying layer 19, and the upper cladding layer 6. The facet film of the present embodiment is a type of anti-reflection coating (AR). Also, the CSG-DBR region B in an end opposite to the SG-DFB region A provides a facet 17 with another film that covers edges of the substrate 1, the lower cladding layer 2, the optical waveguide layer 4, and the upper cladding layer 6. The facet film is also a type of the AR coating. The facets, 16 and 17, will be called as a front facet and a rear facet, respectively, of the wavelength tunable LD 30 in the explanation below.

The substrate 1 may be made of n-type InP, the lower cladding layer 2 may be made of n-type InP, while, the upper cladding layer 6 may be made of p-type InP. The lower cladding layer 2 and the upper cladding layer 6 may confine light within the active layer 3, the optical waveguide layer 4, and the amplifying layer 19 in respective regions, A to C.

The active layer 3, which shows an optical gain, may have a quantum well structure formed by, for instance, well layers and barrier layers alternately stacked to each other, where the well layers are each made of $Ga_{0.32}In_{0.68}As_{0.92}P_{0.08}$ with a thickness of 5 nm and barrier layers are each made of $Ga_{0.22}In_{0.78}As_{0.47}P_{0.53}$ with a thickness of 10 nm. The optical waveguide layer 4 may be formed by a bulk $Ga_{0.22}In_{0.78}As_{0.47}P_{0.53}$ having bandgap energy greater than that of the active layer 3. The amplifying layer 19 also shows an optical gain supplied with a current from the electrode 21. The amplifying layer 19 may also have the quantum well structure of the well layers each made of $Ga_{0.35}In_{0.65}As_{0.99}P_{0.01}$ with a thickness of 5 nm and the barrier layers each made of $Ga_{0.15}In_{0.85}As_{0.32}P_{0.68}$ with a thickness of 10 nm. In an alternative, the amplifying layer 19 may have a bulk structure made of $Ga_{0.44}In_{0.56}As_{0.95}P_{0.05}$, or may be formed by materials identical with those of the active layer 3.

The contact layers, 7 and 20, may be made of p-type $Ga_{0.47}In_{0.53}As$. The insulating film 9 is made of silicon nitride (SiN) or silicon oxide ($SiO_2$), which protects or passivates the semiconductor materials therebeneath. The heaters 10 are alloy of titanium and tungsten (TiW) with a thin film configuration. The heaters 10 each may extend several segments in the CSG-DBR region B, where one segment may be demarcated by one grating region in the lower cladding layer 2 and a region without any optical gratings and adjacent to the one grating region. The electrodes, 8 and 21, the supply electrode 11, and the ground electrode 12 include gold (Au). The substrate 1 further provides a back electrode 15 in a back surface thereof. The back electrode 15 extends all over the SG-DFB region A, the CSG-DBR region B, and the SOA region C.

The AR coatings in the facets, 16 and 17, have reflectivity smaller than 1.0%, which means that substantially no reflection occurs thereat. The AR coatings may be made of multi-layered dielectric films including $MgF_2$ and TiON alternately stacked to each other. The present wavelength tunable LD 30 provides the AR coating in the rear facet 17; but a wavelength tunable LD may have a reflective film in the rear facet 17. That is, when a wavelength tunable LD provides an optical absorbing structure adjacent to the rear facet 17, namely, between the CSG-DBR region C and the rear facet 17, a reflective film showing substantial reflectivity may effectively suppress light output from the rear facet 17. In such an arrangement, the reflective film in the rear facet 17 may have reflectivity greater than 10% for the laser light coming from the CSG-DBR region B.

Grating regions (periodic structures) 18 are formed within the lower cladding layer 2 in the SG-DFB region A and the CSG-DBR region B so as to secure a space therebetween, which makes the sampled grating in the SG-DFB region A and in the CSG-DBR region B. One grating region, which includes periodic structures each distinguishable in refractive index thereof from a plain region surrounding respective periodic structures, and one space region, which is neighbor to the one grating region and has no periodic structures, form one segment. In other words, one segment may include one space region placed between the grating regions and one of grating regions setting the space region therebetween. The periodic structures are made of material different from that of the lower cladding layer 2. For instance, when the lower cladding layer 2 is made of n-type InP, the periodic structures 18 may be made of $Ga_{0.22}In_{0.78}As_{0.47}P_{0.53}$.

The periodic structures 18 in the grating regions may be formed by the interference exposure using two optical beams. The double exposure technique may form the space regions between the grating regions. That is, a photoresist is first patterned in the periodic structures in whole regions, A to C, by the two-beam interference exposure; then, the second exposure erases periodic patterns of the photoresist in regions corresponding to the space regions. Thus, a patterned photoresist having the periodic patterns corresponding to the periodic structures 18 is left on the quaternary material, $Ga_{0.22}In_{0.78}As_{0.47}P_{0.53}$. Partially etching the quaternary material and burying the etched regions with a semiconductor material different from that of the quaternary material, which is InP in the present embodiment, the periodic structures 18 are buried within the lower cladding layer 2. Accordingly, the periodic structures 18 are sometimes called as corrugations. The periodic structures in the SG-DFB region A may have a pitch same with a pitch of the periodic structures in the CSG-DBR region B in the present wavelength tunable LD 30. However, the pitches in the respective regions, A and B, may be different from each other. Also, the periodic structures 18 may have a constant length in respective segments, but may have specific lengths different from others. Or, the periodic structure 18 in the SG-DFB region A have a length common in the SG-DFB region A and the periodic structures 18 in the CSG-DBR region B have a length also common in the CSG-DBR region B but different from the common length in the SG-DFB region A.

The sampled grating in the SG-DFB region A, accompanied with the active layer 3 therein, is inherently attributed to a gain spectrum having discrete peaks with equalized strengths and a constant span to a neighbor peak. While, the sampled grating in the CSG-DBR region B is attributed to a reflection spectrum having discrete peaks with strengths depending on a wavelength and a constant span to a neighbor peak because the CSG-DBR region B provides at least two types of the segments having optical lengths different from each other. Also, the span between the gain peaks attributed to the SG-DFB region A is different from the span between the reflection peaks attributed to the CSG-DBR region B. Accordingly, the wavelength tunable LD 30 of the embodiment may tune the emission wavelength by coinciding a wavelength of one of the gain peaks with a wavelength of one of the reflection peaks.

A current source 41 supplies currents to the electrode 8 in the SG-DFB region A and the electrode 11 in the CSG-DBR region B, where the currents are determined based on the emission wavelength of the wavelength tunable LD 30. The wavelength tunable LD 30, supplied with thus determined currents to the electrodes, 8 and 11, may emit the laser light having the preset wavelength. The current source 41 maintains the magnitudes of the currents as far as the emission wavelength of the wavelength tunable LD 30 is set at the preset wavelength.

Referring to FIG. 1 again, the optical splitter 31 splits the laser light, which has one polarization and is output from the front facet 16 of the wavelength tunable LD 30, into two portions, one of which enters the other optical splitter 32, while, the other is output from the optical transmitter 100. The one polarization of the wavelength tunable LD 30 is in parallel to the active layer 3, the optical waveguide layer 4, and the amplifying layer 19, namely, in perpendicular to the stacking direction of the semiconductor layers in the wavelength tunable LD 30. Moreover, because FIG. 1 is a plan view of the arrangement of the optical transmitter 100 and the optical plane is in parallel to the page of FIG. 1, the one direction of the polarization becomes in parallel to the page of FIG. 1.

The optical splitter 32 further splits the optical signal coming from the optical splitter 31, one of which transmits through the optical splitter 32 and enters the photo-detector 33, while, the other is reflected thereby toward the VOA 35. The photo-detector 33 generates an electrical signal whose magnitude is proportional to magnitude of light entering the photo-detector 33. The optical splitters, 31 and 32, and the photo-detector 33 have no polarization dependence in the transmittance or the reflectance and the optical sensitivity thereof; accordingly, the electrical signal generated by the photo-detector 33 directly reflects the power of the laser light output from the front facet 16 of the wavelength tunable LD 30. Moreover, because two optical splitters, 31 and 32, may not rotate the polarization of the laser light subject thereto, the laser light reflected twice by the optical splitters, 31 and 32, have the polarization same with that just output from the wavelength tunable LD 30. The power controller 34 feeds the output of the photo-detector 33 back to the SOA in the wavelength tunable LD 30 such that the electrical signal generated by the photo-detector 33 becomes constant in preset magnitude, which is often called as the auto-power control (APC).

A portion of the laser light reflected by the second optical splitter 32 enters the VOA 35 that attenuates thus entering light and provides the attenuated light to the third optical splitter 36 that further splits the light into two part, one of which transmits therethrough to the second photo-detector 37, while, the other is reflected thereby toward the mirror 39. The second photo-detector 37 generates an electrical signal which is proportional to power of the incoming light attenuated by the VOA 35. The VOA 35, the optical splitter 36, and the optical detector 37 have no function to rotate the polarization of the light subject thereto, and no polarization dependence in the attenuation, the transmittance, and the sensitivity; accordingly, the photo-detector 37 may detect the power of the light output from the wavelength tunable LD 30 and attenuated by the VOA 35 as the polarization thereof may be maintained. The power controller 38, receiving the electrical output of the photo-detector 37, may adjust the attenuation of the VOA 35 such that the electrical output of the photo-detector 37 is kept in a preset condition. The other part of the optical signal reflected by the splitter 36 enters the λ/2 plate 40 reflected by the mirror 39. The λ/2 plate 40 rotates the polarization of light entering thereto by 90° during propagating therethrough and provides thus polarization-rotated optical signal into the wavelength tunable LD 30 from the rear facet 17 thereof as the feedback light when the fast axis of the λ/2 plate makes an angle of 45° with respect to the direction of the polarization of light incident thereto.

Thus, the optical path including the optical splitters, 31 and 32, the VOA 35, the optical splitter 36, the mirror 39, and the λ/2 plate 40 constitutes a feedback unit, what is called, polarization rotated optical feedback (PROF) loop; and the optical detector 37 and the power controller 38 accompanied with the VOA 35 determine the magnitude of the feedback light.

The frequency fluctuation Δv in the laser oscillation, namely, the chirp in the laser emission, is determined by the fluctuation of the carrier concentration ΔN in the optical cavity; that is, the frequency fluctuation Δv is given by:

$$\Delta v = (\alpha/4\pi) \cdot \Gamma \cdot v_g \cdot a \cdot \Delta N \quad (1)$$

where α, Γ, vg, and a are a parameter relating to the fluctuation in the refractive index of the cavity, an optical confining co-efficient, a group velocity of light, and a differential gain, respectively.

According to the equation (1) above, the reduction of the fluctuation ΔN in the carrier concentration may decrease the frequency fluctuation Δv, exactly, the negative feedback of the fluctuation of the carrier concentration ΔN may effectively reduce the frequency fluctuation Δv of the laser oscillation by a loop of increment of the carrier concentration→increment of the photon density→increment of the feedback light→increment of the photon density→decrement of the carrier concentration.

However, when the optical feedback to the laser cavity is carried out by light with the polarization same with that of the light output from the laser cavity, the laser oscillation becomes extraordinally instable. Accordingly, the light fed back to the laser cavity is necessary to have the polarization in perpendicular to that of the light output from the laser cavity. Such light fed back to the laser cavity of the specific polarization shows no contribution to the rate equation including the photon density and the phase of the light, and may effectively stabilize the laser oscillation. An LD, in particular, in an LD of the type of the edge emitting, generally shows a large difference in an optical gain thereof for light having the polarization in perpendicular to the active layer and that in parallel to the active layer. Accordingly, the light with the polarization in perpendicular to the active layer and fed back to the laser cavity shows substantially no contribution to the laser oscillation, but shows substantial contribution only to the carrier concentration.

The optical transmitter 100 of the present invention feeds a portion of the laser light output from the wavelength tunable LD 30 back to the laser cavity as rotating the polarization thereof by 90° such that the frequency fluctuation of the wavelength tunable LD 30 becomes smaller, or preferable minimum, by adjusting the power of the feedback light. That is, the controller 38 sets the power of the feedback light with the polarization thereof in perpendicular to that output from the wavelength tunable LD 30 so as to be in constant at a value where the frequency fluctuation becomes minimum. In other word, the controller 38 performs the automatic power control with respect to the feedback light entering the laser cavity with the polarization perpendicular to that of the laser light output from the wavelength tunable LD 30 such that the frequency fluctuation is maintained in minimum. The power of the feedback light entering the laser cavity may be determined in advance to the practical operation of the optical transmitter 100. Also, although the wavelength tunable LD 30 may tune the emission wavelength thereof, the tune is carried out by adjusting the currents supplied to the SG-DFB region A and the CSG-DBR region B independent of the optical feedback, which means that, even the emission wavelength may be tuned, the frequency fluctuation or the frequency noises of the laser emission may be independently controlled in a minimum.

The frequency fluctuation may possibly depend on the tuned wavelength. Accordingly, the magnitude of the feedback light to the laser cavity is preferably set depending on the emission wavelengths thereof. A table may hold relations between the emission wavelength and the power of the feedback light to the laser cavity, which may be stored in a controller of the optical transmitter 100 as a memory-lookup-table. Also, the wavelength tunable LD 30 provides the AR coatings in the respective facets thereof, 16 and 17, which means that no laser cavity are formed in the optical feedback loop from the front facet 16 to the rear facets 17 of the wavelength tunable LD 30.

The optical transmitter 100 of the present invention may show stable performance in the frequency noise or the frequency fluctuation in a wide range of the wavelength only by implementing a simple feedback loop and electronic control circuits. In order to minimize the frequency noise, only the power of the light fed back to the laser cavity is controlled without implementing electronic circuit operable in higher frequencies and/or function to adjust phase delays in the optical feedback loop. Also, the feedback light to the laser cavity does not cause interference with the laser light output from the wavelength tunable LD 30 and has the magnitude far smaller than that of the laser light. Accordingly, the existence of the optical feedback loop gives substantially no contribution to the power and the side mode suppression ration of the laser light.

The λ/2 plate 40 rotates the polarization by 90°, but an optical component that rotates the polarization by 90±5° may effectively reduce the frequency fluctuation. For instance, a polarization rotator that implements a material showing a magneto-optical effect accompanied with a magnet, which is often called as a Farady rotator, may rotate the polarization of the laser light by 90±5° similar to the λ/2 plate 40 of the embodiment.

Second Embodiment

Figure 3:
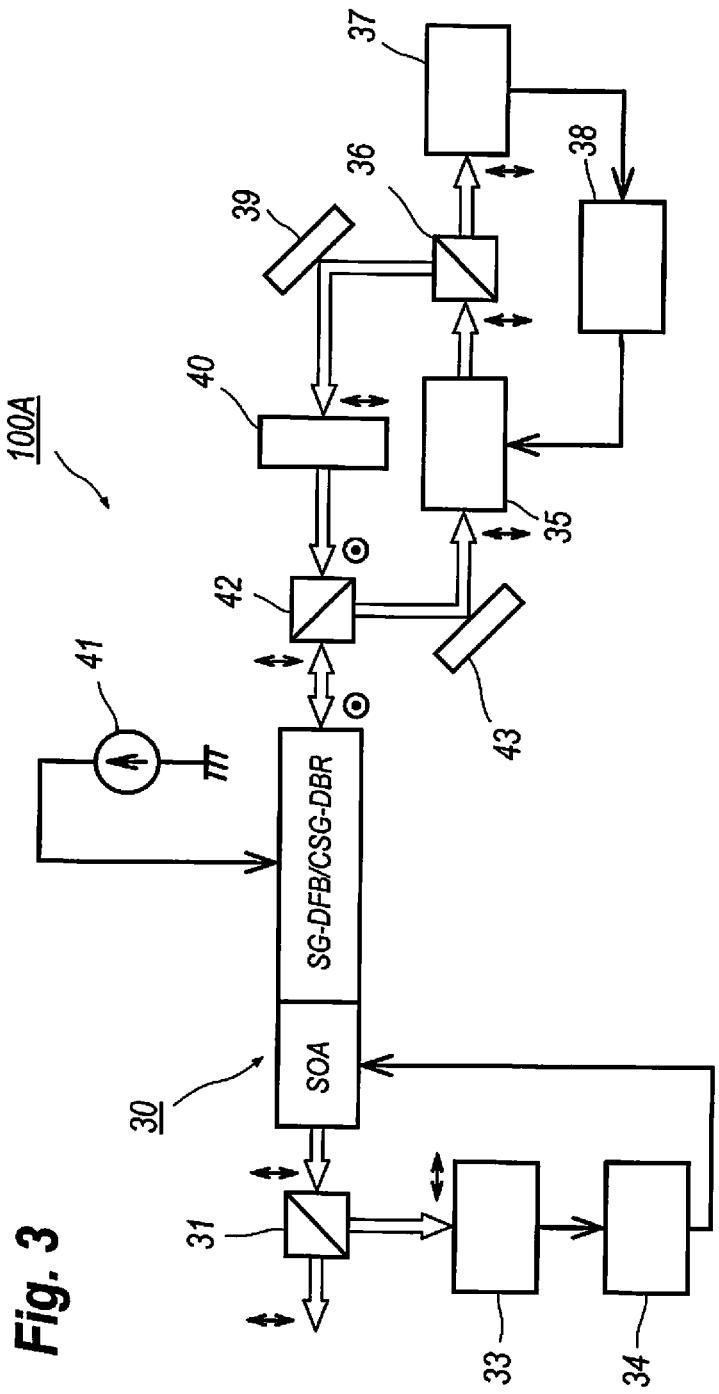
FIG. 3 is a schematically illustrating plan view of a functional block diagram of an optical transmitter according to the second embodiment of the invention.

FIG. 3 is a schematically illustrating plan view of a functional block diagram of an optical transmitter 100A according to the second embodiment of the present invention. Comparing with the arrangement shown in FIG. 3 with those shown in FIG. 1 for the optical transmitter 100, the optical transmitter 100A further provides a polarization beam splitter (PBS) 42 and a mirror 43 but removes the second optical splitter 32.

The optical transmitter 100A does not feed the laser light which is output from the front facet 16 back to the rear facet 17 of the wavelength tunable LD 30, which means the optical transmitter 100A may omit the second optical splitter 32. Exactly, the second optical splitter 32 is replaced to the PBS 42 that splits the laser light output from the rear facet 17. That is, the PBS 42 transmits the feedback light entering the wavelength tunable LD 30 whose polarization is perpendicular to the page but reflects the laser light coming from the wavelength tunable LD 30 whose polarization is parallel to the page of FIG. 3. The optical plane may be set in parallel to the page of FIG. 3. The wavelength tunable LD 30 may output the laser light whose polarization is in parallel to the active layer 3, or in perpendicular to the stacking direction of the semiconductor layers, 3 to 5, in the SG-DFB region A.

The arrangement for the laser light output from the front facet 16 of the wavelength tunable LD 30 is substantially same as those in the first embodiment except for the second optical splitter 32 that splits the laser light coming from the first optical splitter 31 toward the VOA 35. The photo-detector 33 detects the laser light output from the front facet 16 and split by the optical splitter 31. The photo-detector 33, the power controller 34, and the SOA region C in the wavelength tunable LD 30 may perform the automatic power control (APC) function for the laser light output from front facet 16 of the wavelength tunable LD 30.

In the optical arrangement set in the rear of the wavelength tunable LD 30, the PBS 42 may reflect the laser light with the polarization in parallel to the page, while, transmit the feedback light with the polarization in perpendicular to the page. The photo-detector 37 may receive the laser light with the polarization in parallel to the page, which is output from the rear facet 17 of the wavelength tunable LD 30, split by the PBS 42, attenuated by the VOA 35, and transmits through the optical splitter 36. The VOA 35 may attenuate the laser light entering thereto such that the power detected by the photo-detector 37 is kept constant under the control of the power controller 38. The laser light entering the λ/2 plate 40 rotates the polarization thereof during the propagation within the λ/2 plate 40. That is, the laser light entering the λ/2 plate 40 is rotated in the polarization thereof by 90°, and outputs therefrom laser light with the polarization perpendicular to the page. The PBS 42 may transmit light with the polarization perpendicular to the page. Accordingly, the light output from the λ/2 may transmit the PBS 42 and enter the wavelength tunable LD 30 from the rear facet 17 thereof as the feedback light.

Thus, the second embodiment shown in FIG. 2 constitutes the PROF loop for the laser light output from the rear facet 17 of the wavelength tunable LD 30; that is, the PROF loop may be constituted only by the optical components arranged in the rear of the wavelength tunable LD 30. Also, the current source 41 may stabilize the emission wavelength of the wavelength tunable LD 30. The PBS 42 may extract a portion of the laser light output from the wavelength tunable LD 30. The λ/2 plate 40 may rotate the polarization of the laser light entering therein during the propagation therethrough. The VOA 35 and the power controller may determine the amount of the PROF.

Third Embodiment

Figure 4:
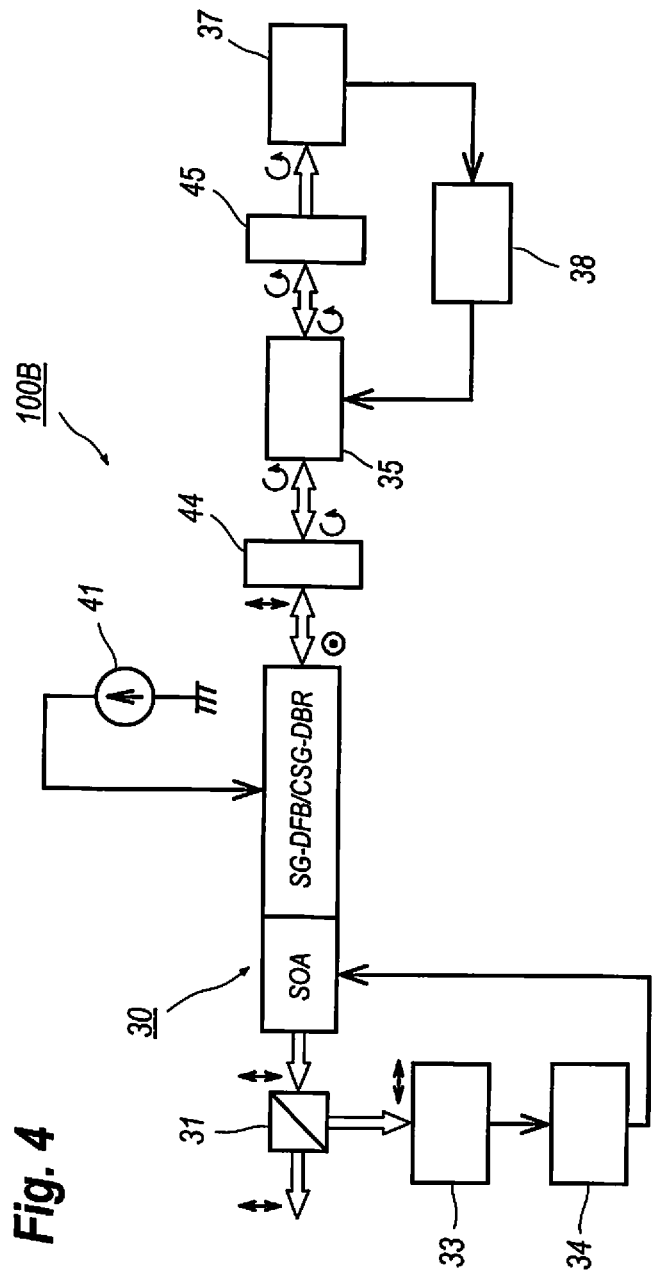
FIG. 4 is a plan view of a functional block diagram of the optical transmitter according to the third embodiment of the present invention.

FIG. 4 is a plan view of a functional block diagram of an optical transmitter 100B according to the third embodiment of the present invention. The optical transmitter 100B omits, compared with those of the first embodiment show in FIG. 1, the optical splitters, 32 and 36, the mirror 39, and the λ/2 plate 40 but implements a quarter wave (λ/4) plate 44 and a mirror 45. The mirror 45 has transmittance of less than several per-cent, for instance, smaller than 5%, for wavelengths subject to the wavelength tunable LD 30. The arrangement for the laser light output from the front facet 16 is same with those of the second embodiment.

The laser light output from the rear facet 17 of the wavelength tunable LD 30, which has the polarization parallel to the page, enters the VOA 35 after transmitting through the λ/4 plate 44 that convers the laser light from the linear polarization into a circular polarization when the fast axis of the λ/4 plate makes an angle of 45° with respect to the polarization of the incident light. The VOA 35 attenuates the light entering thereto and outputs the attenuated light to the mirror 45. The mirror 45 transmits a portion the light reaching thereto, typically several per-cent thereof, and reflects the rest of the light. The reflected light passes the VOA 35 again as attenuated thereby and enters the λ/4 plate 44 from the rear thereof. The λ/4 plate 44 converts the polarization of the light from the circular polarization into the linear polarization but the direction thereof is perpendicular to that of the laser light just output from the rear facet 17. The VOA 35 and the mirror 45 have no function to modify the polarization of the light subject thereto; accordingly, the laser light output from the λ/4 plate 44 and returning the wavelength tunable LD 30 has the polarization perpendicular to the page. That is, when the laser light output from the rear facet 17 of the wavelength tunable LD 30 has the polarization in parallel to the page, the light returning the wavelength tunable LD 30 from the λ/4 plate 44 has the polarization in perpendicular to the page.

The optical transmitter 100B thus described may constitute the PROF loop only by putting the λ/4 plate 44 and the VOA 35 between the wavelength tunable LD 30 and the mirror 45, which means that the optical path of the PROF loop may be shortened compared with those shown in FIGS. 1 and 3, and reduce the frequency fluctuation in a wide range. The VOA 35 and mirror 45 may be integrally formed as a variable reflectivity filter. Also, the photo-detector 37, the power controller 38 and the VOA 35 may adjust the feedback amount of the PROF loop.

Fourth Embodiment

Figure 5:
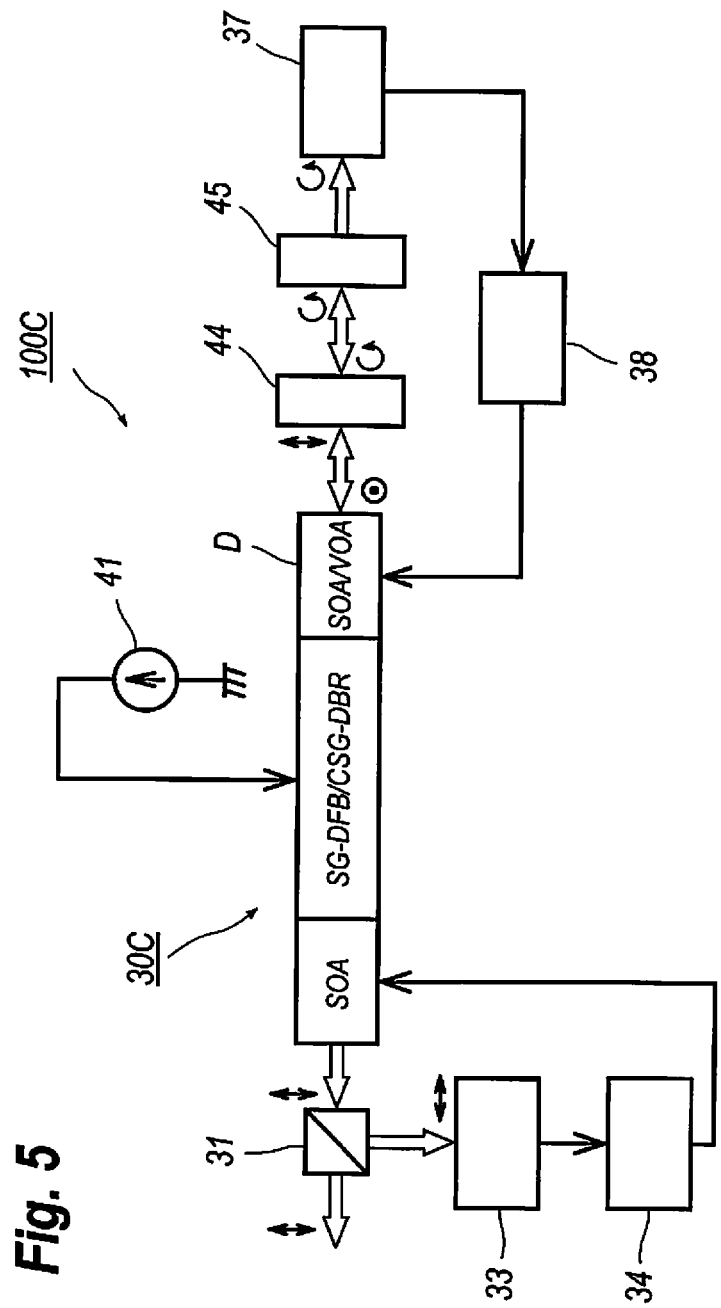
FIG. 5 is a plan view of a functional block diagram of an optical transmitter according to the fourth embodiment of the invention.

FIG. 5 is a plan view of a functional block diagram of an optical transmitter 100C according to the fourth embodiment of the invention. The optical transmitter 100C has a feature distinguishable from the optical transmitter 100B shown in FIG. 4 in that the optical transmitter 100C removes the VOA 35 but has a wavelength tunable LD 30C with an arrangement different from the wavelength tunable LD 30 of the aforementioned embodiment. That is, the wavelength tunable LD 30C of the present embodiment includes another SOA region D between the rear facet 17 and the CSG-DBR regions B. The configuration and the function of the SOA region D are same with those of the SOA region C. That is, the SOA region D operates as an optically amplifying unit and/or an optically attenuating unit depending on a bias current supplied from the power controller 38. The power controller 38, receiving the output of the photo-detector 37, generates a control signal supplied to the other SOA region D in the wavelength tunable LD 30C.

The optical transmitter 100C of the present embodiment removes the VOA 35 but implements the other SOA region D in the wavelength tunable LD 30C, which may further shorten the optical path for the PROF loop, which means that the frequency noise, or the frequency fluctuation in the laser oscillation may be reduced in still wider frequency range. The wavelength tunable LD 30C of the present embodiment may provide the AR coating in the rear facet 17.

Fifth Embodiment

Figure 6:
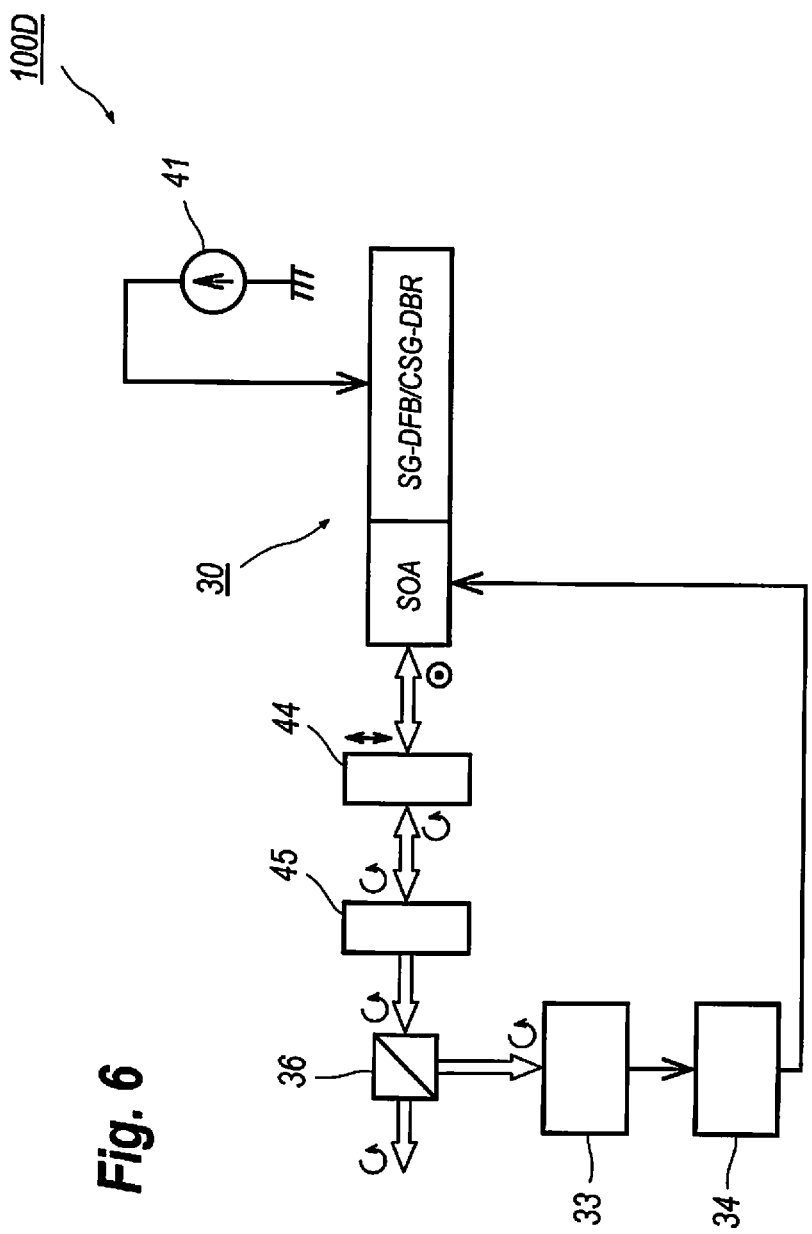
FIG. 6 is a plan view of a functional block diagram of the optical transmitter according to the fifth embodiment of the invention.

FIG. 6 is a plan view of a functional block diagram of an optical transmitter 100D according to the fifth embodiment of the invention. The optical transmitter 100D removes the optical splitters, 31 and 32, photo-detector 37, the power controller 38, the VOA 35, the mirror 39, and the λ/2 plate 40 from the arrangement shown in FIG. 1 but further implements a λ/4 plate 44 and the mirror 45 between the front facet 16 of the wavelength tunable LD 30 and the optical splitter 36.

The laser light output from the front facet 16 of the wavelength tunable LD 30, which has the polarization parallel to the page, enters the λ/4 plate 44. The λ/4 plate 44, as described above, converts the polarization of the light entering thereto into the circular polarization. The light output from the λ/4 plate 44 enters the mirror 45 and a portion thereof is reflected thereby, while a rest transmits therethrough and output from the optical transmitter 100D through the optical splitter 36. The portion of the light reflected by the mirror 45 returns the λ/4 plate 44 and converted into the linear polarization but the direction thereof is perpendicular to that output from the wavelength tunable LD 30, that is, perpendicular to the page of FIG. 6. Thus, the portion of the light reflected by the mirror 45 and returning the wavelength tunable LD 30 through the λ/4 plate 44 twice has the polarization perpendicular to the optical plane of the optical transmitter 100D. The portion of the light whose polarization is in perpendicular to the page returns the wavelength tunable LD 30 from the front facet 16.

The optical splitter 36 partially transmits the laser light passing though the mirror 45 and partially reflects the laser light toward the photo-detector 33. The photo-detector 33, the power controller 34, and the SOA region C in the wavelength tunable LD 30 constitute the APC loop that maintain the optical power output from the optical transmitter 100D through the optical splitter 36 in constant. The PROF loop may be implemented in the front of the wavelength tunable LD 30. However, because the PROF loop constituted by the SOA region C, the λ/4 plate 44, and the mirror 45 have no component to adjust the optical power transmitting therethrough or reflecting thereby. Only the SOA region C may vary the amplification factor thereof by adjusting a bias current supplied thereto. However, the bias current to the SOA region C is also subject to the APC loop. The mirror 45 may have variable reflectivity which is externally controlled.

Sixth Embodiment

Figure 7:
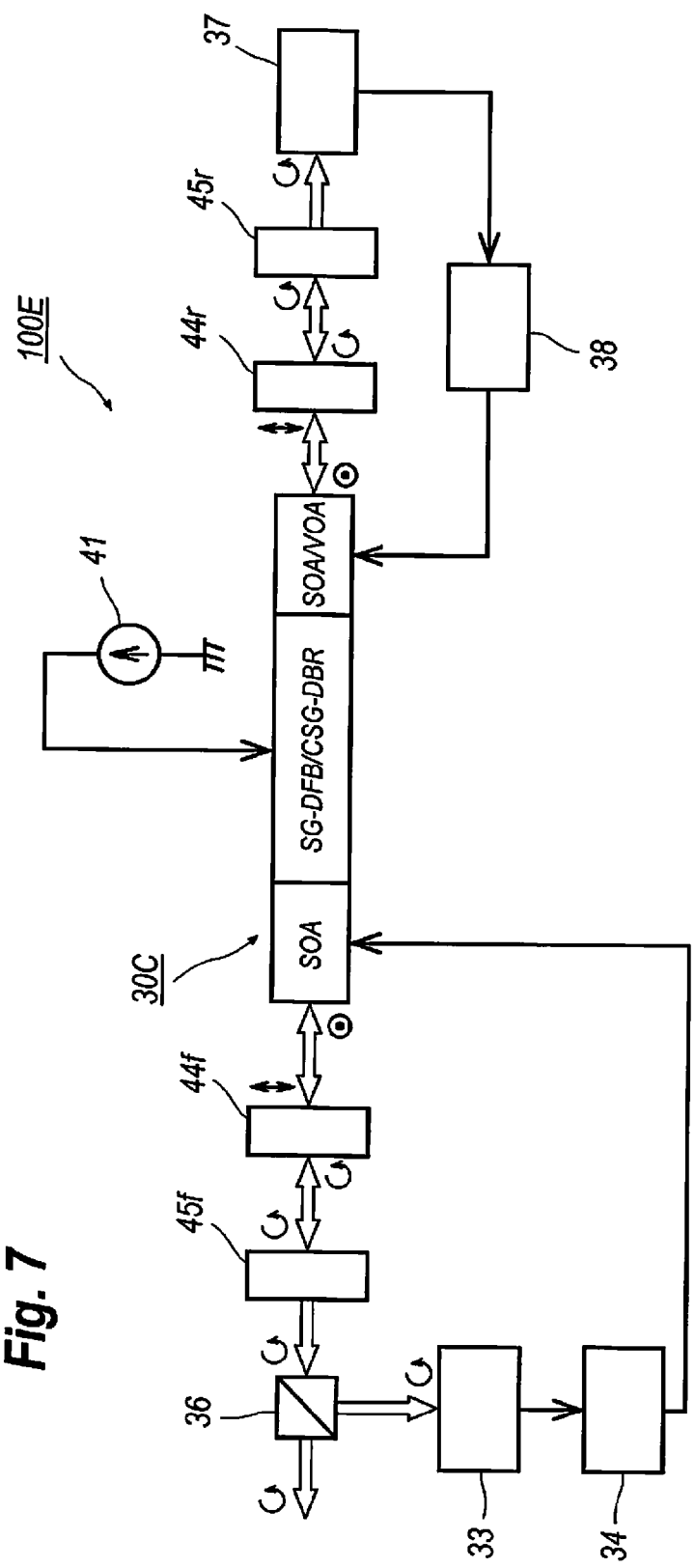
FIG. 7 is a plan view of a functional block diagram of still another optical transmitter according the sixth embodiment of the invention.

FIG. 7 is a plan view of a functional block diagram of still another optical transmitter 100E according the sixth embodiment of the invention. The optical transmitter 100E, compared with the former embodiment 100D, replaces the wavelength tunable LD 30 into the wavelength tunable LD 30C and further provides a set of a λ/4 plate 44r and a mirror 45r for the laser light output from the rear facet 17 of the wavelength tunable LD 30C. The set in the front side of the wavelength tunable LD 30C is denoted as a λ/4 plate 44f and a mirror 45f. The set in the rear shows the function same with the set of the front; that is, the λ/4 plate 44r and the mirror 45r constitute the PROF loop for the laser light output from the rear facet 17 of the wavelength tunable LD 30C, specifically, the λ/4 plate 44r and the mirror 45r feeds a portion of the laser light output from the rear facet of the wavelength tunable LD 30C back thereto as rotating the polarization thereof by 90°. The magnitude of the feedback light returning the wavelength tunable LD 30C from the rear facet 17 may be adjustable by the power control loop of the photo-detector 37, the power controller 38 and the other SOA region D in the wavelength tunable LD 30C. The optical transmitter 100E like the present embodiment may implement the PROF loop both in the front and the rear of the wavelength tunable LD 30C. The examples shown in FIGS. 4 to 7 provides the mirrors 45, 45r, and 45f, that reflects the light transmitting through the λ/4 plate, 44, 44r and 44f, for the bi-direction feedback loop for the laser light output from the rear facet 17. Accordingly, these mirrors, 45, 45r, and 45f, and the λ/4 plates, 44, 44r, and 44f, may provide the function same with the optical splitters, 31, 32, 36, 42, the mirrors, 43 and 39, and the λ/2 plate 40 of the uni-direction feedback loop shown in FIGS. 1 and 3.

Seventh Embodiment

Figure 8:
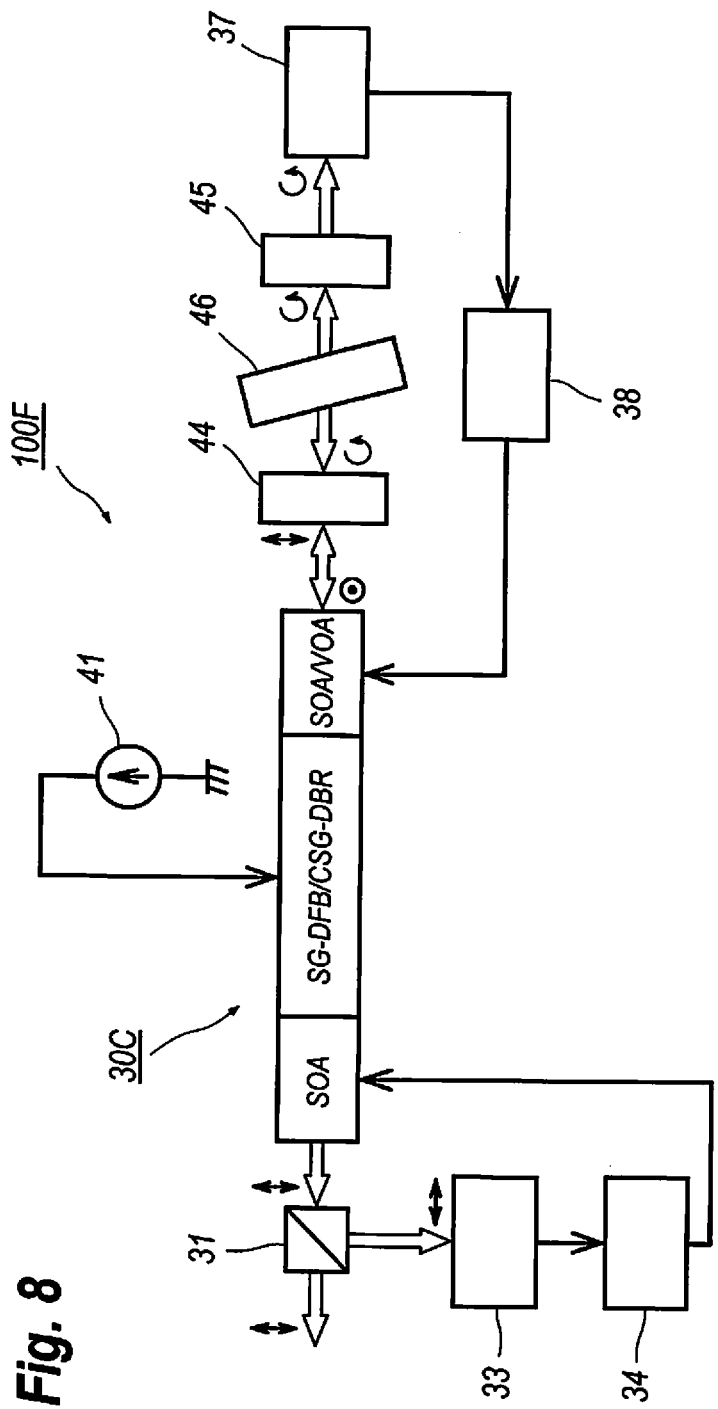
FIG. 8 is a plan view of a functional block diagram of an optical transmitter according to the seventh embodiment of the present invention.

FIG. 8 is a plan view of a functional block diagram of an optical transmitter 100F according to the seventh embodiment of the present invention. The optical transmitter 100F, which is comparable to the optical transmitter 100C shown in FIG. 5, provides an etalon filter 46 between the λ/4 plate 44 and the mirror 45.

As equation (1) denotes, the frequency fluctuation Δv depends on the carrier fluctuation ΔN. Insertion of an optical device that shows optical loss depending on a wavelength within the PROF loop may further reduce the frequency fluctuation Δv. The present embodiment implements the etalon filter within the PROF loop. The etalon filter is known as an optical device whose transmittance periodically varies. Accordingly, when the oscillation frequency increases, which corresponds to a condition where the etalon filter 46 in the transmittance thereof increases, the feedback amount of the RPOF loop increases. Accordingly, the carrier fluctuation ΔN in the SG-DFB region A in the wavelength tunable LD 30C may be further suppressed. Moreover, because the transmittance of the etalon filter 46 shows frequency dependence, the frequency fluctuation Δv of the laser oscillation directly reflects in amplitude of the light transmitting therethrough. Accordingly, feeding the amplitude of the signal generated by the photo-detector 37 back to the other SOA region D in the wavelength tunable LD 30C through the power controller 38 such that the output fluctuation of the photo-detector 37 becomes a minimum, the frequency fluctuation Δv may be further effectively reduced. The transmittance of the etalon filter 46 depends on a temperature thereof or an angle of the light entering thereto; accordingly, the feedback amount of the PROF loop may be varied by adjusting the temperature of the etalon or the angle of the incident light.

Eighth Embodiment

Figure 9:
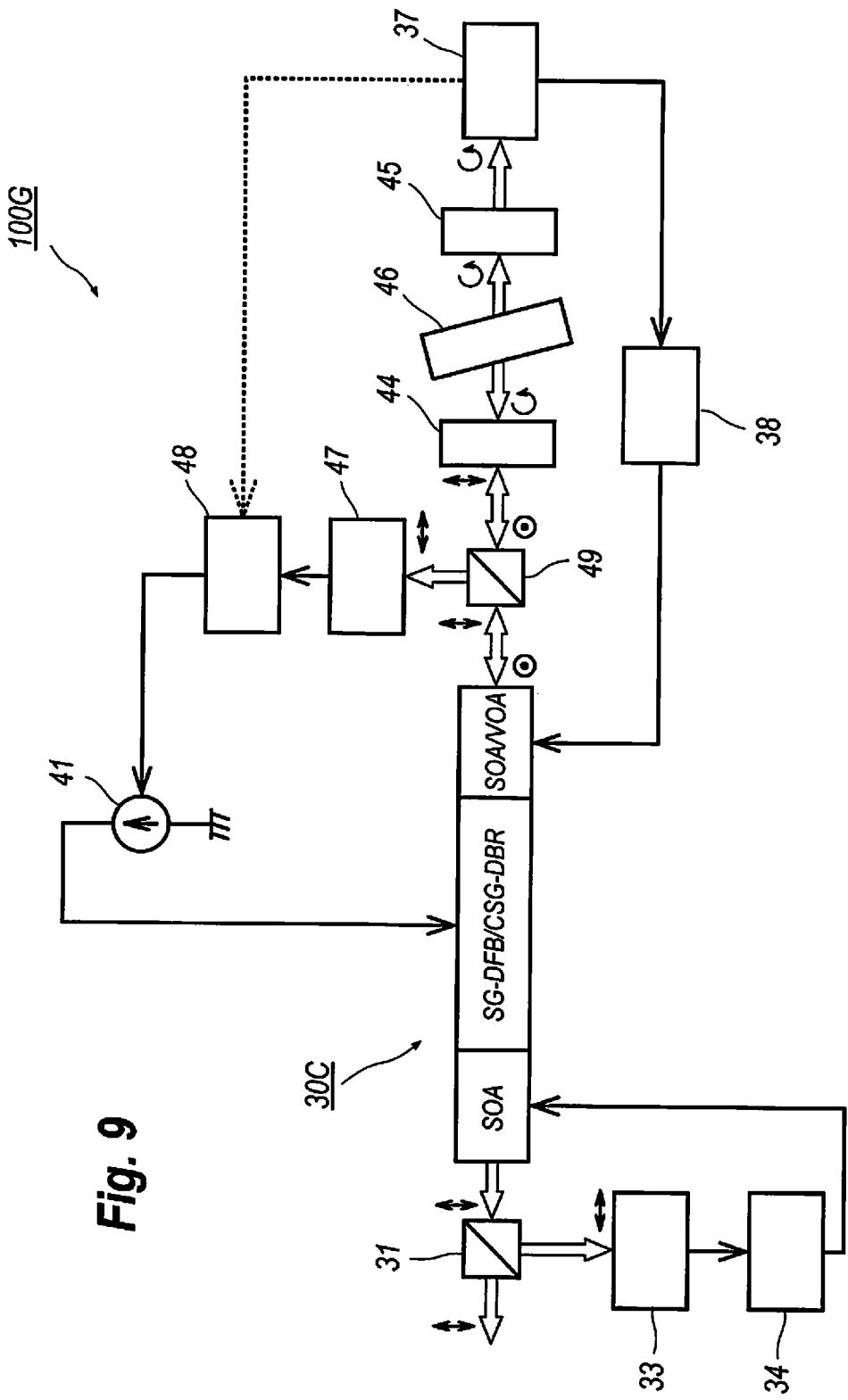
FIG. 9 is a plan view of a functional block diagram of an optical transmitter according to the eighth embodiment of the invention.

FIG. 9 is a plan view of a functional block diagram of an optical transmitter 100G according to the eighth embodiment of the invention. The optical transmitter 100G further includes, compared with those of the former embodiment shown in FIG. 8, an optical splitter 49, a photo-detector 47, and a wavelength controller 48. The optical splitter 49 splits the laser light output from the rear facet 17 of the wavelength tunable LD 30C, where the laser light has the polarization parallel to the optical plane, namely, parallel to the page, into two portions, one of which is reflected thereby toward the photo-detector 47, while, the other is transmitted therethrough toward the λ/4 plate 44 and returned by the mirror 45 through the etalon filter 46.

The photo-detector 47 generates an electrical signal proportional to the power of the raw light output from wavelength tunable LID 30C, while, the photo-detector 37 may detect the optical power output from the wavelength tunable LD 30C but transmitting through the etalon filter 46, that is, the light affected by the transmittance of the etalon filter 46. The outputs of the photo-detectors, 37 and 47, are provided to the wavelength controller 48 and compared with a preset parameter corresponding to the transmittance of the etalon filter 46 at a target wavelength of the wavelength tunable LD 30C. That is, a ratio of the output of the photo-detector 37 to the output of the photo-detector 47 corresponds to transmittance of the etalon filter at a currently set wavelength of the wavelength tunable LD 30C. Comparing thus evaluated ratio with the preset transmittance of the etalon filter 46 at the target wavelength, the optical transmitter 100G may detect an offset of the current wavelength from the target wavelength. The wavelength controller 48, based on thus detected offset, may control the current source 41 such that the current wavelength becomes closer to or equal to the target wavelength. Thus, the photo-detector 37 may be used for tuning the current wavelength of the wavelength tunable LD 30C and controlling the power of the feedback light of the PROF loop.

Ninth Embodiment

Figure 10:
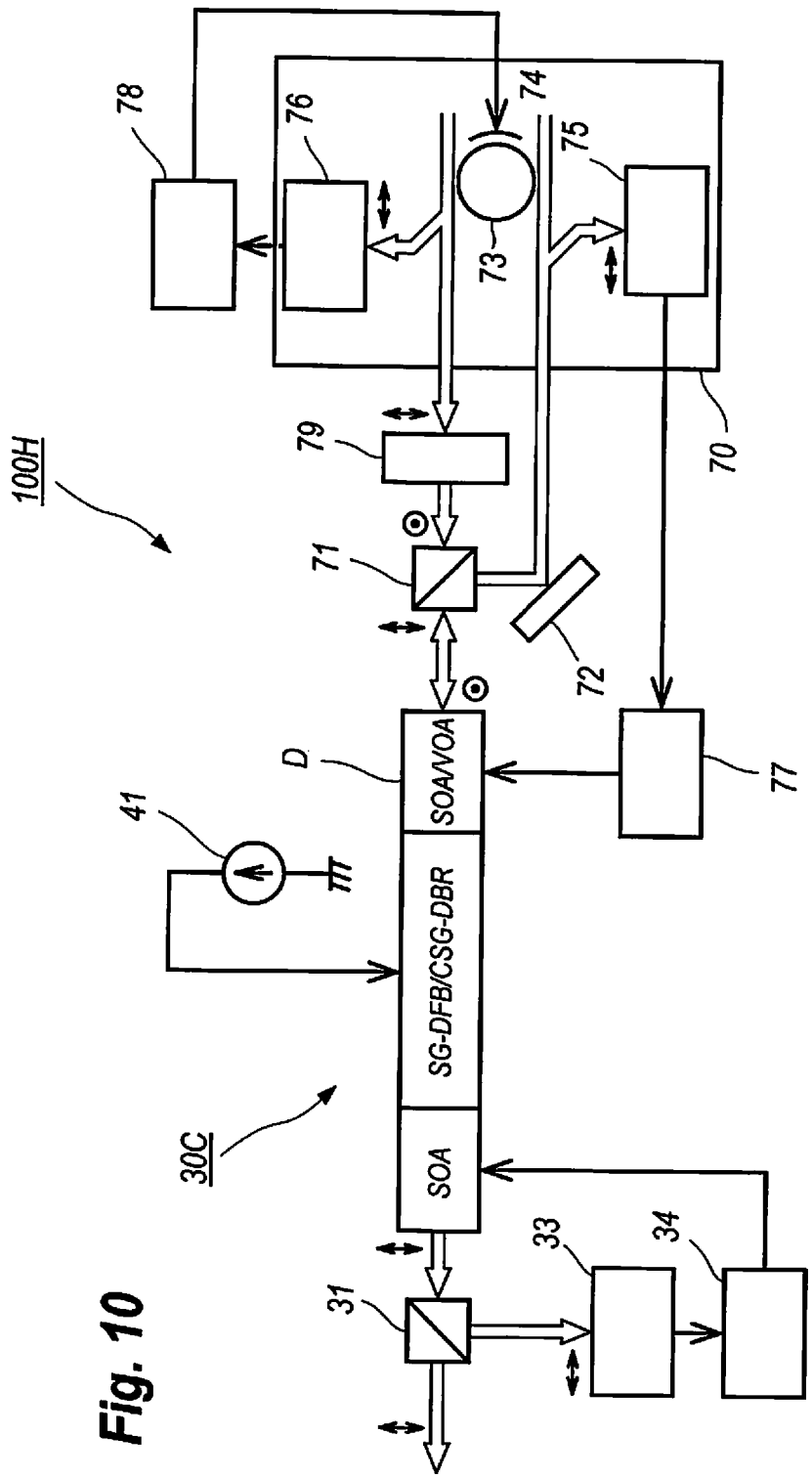
FIG. 10 is a plan view of a functional block diagram of an optical transmitter according to the ninth embodiment of the present invention.

FIG. 10 is a plan view of a functional block diagram of an optical transmitter 100H according to the ninth embodiment of the present invention. The optical transmitter 100H, compared with those of the first embodiment shown in FIG. 1, provides another type of the wavelength tunable LD 30C substituted from the wavelength tunable LD 30, where the wavelength tunable LD 30C monolithically integrating the other SOA region D between the CSG-DBR region B and the rear facet 17 with the other regions, A to C, in the wavelength tunable LD 30. Moreover, the optical transmitter 100H removes the VOA 35, the optical splitter 36, the photo-detector 37, the power controller 38, the mirror 39 and the λ/2 plate 40 but includes a PBS 71, a mirror 72, a ring resonator 73, a heater 74, two photo-detectors, 75 and 76, two power controllers, 77 and 78, and polarization rotator 79. The ring resonator 73, the heater 74, and the photo-detectors, 75 and 76, are a type of waveguide device integrally formed on a substrate 70 made of silicon (Si), which is often called as silicon photonics device.

The PBS 71 reflects the laser light output from the rear facet 17 of the wavelength tunable LD 30C toward the mirror 72, where the laser light has the polarization parallel to the page assuming that the optical plane may be formed by optical axes of the components denoting in FIG. 10. The laser light reflected by the PBS 71 is further reflected by the mirror 72, and finally enters the ring resonator 73. The ring resonator 73 is a type of optical resonator including at least one ring waveguide. One of the photo-detector 75 receives the light entering the ring resonator 73, generates a photo-current corresponding to the received light, and sends the photocurrent to the power controller 77. Because the PBS 71 and the mirror 72 substantially maintain the polarization of light subject thereto, the photo-detectors 75 may detect the power of the laser light emitter from the wavelength tunable LD 30C and entering the ring resonator 73. The controller 77, which may be a type of power controller, maintains the power detected through the photo-detector 75 by varying a bias current supplied to the SOA region D in the wavelength tunable LD 30C, which is the auto-power control (APC).

The laser light output from the ring resonator 73 enters the polarization rotator 79. The other photo-detector 76 may detect the power of the light output from the ring resonator 73. The light, whose polarization is rotated by 90° by the polarization rotator 79, returns the wavelength tunable LD 30C from the rear facet 17 thereof. Because the polarization rotator 79 rotates the polarization of light transmitting therethrough by 90°, the light output from the polarization rotator 79 has the polarization perpendicular to the page of FIG. 10. That is, the feedback light returning the wavelength tunable LD 30C has the polarization different by 90° from the laser light emitted from the wavelength tunable LD 30C. Thus, the PROF (Polarization Rotated Optical Feedback) may be constituted.

Figure 11:
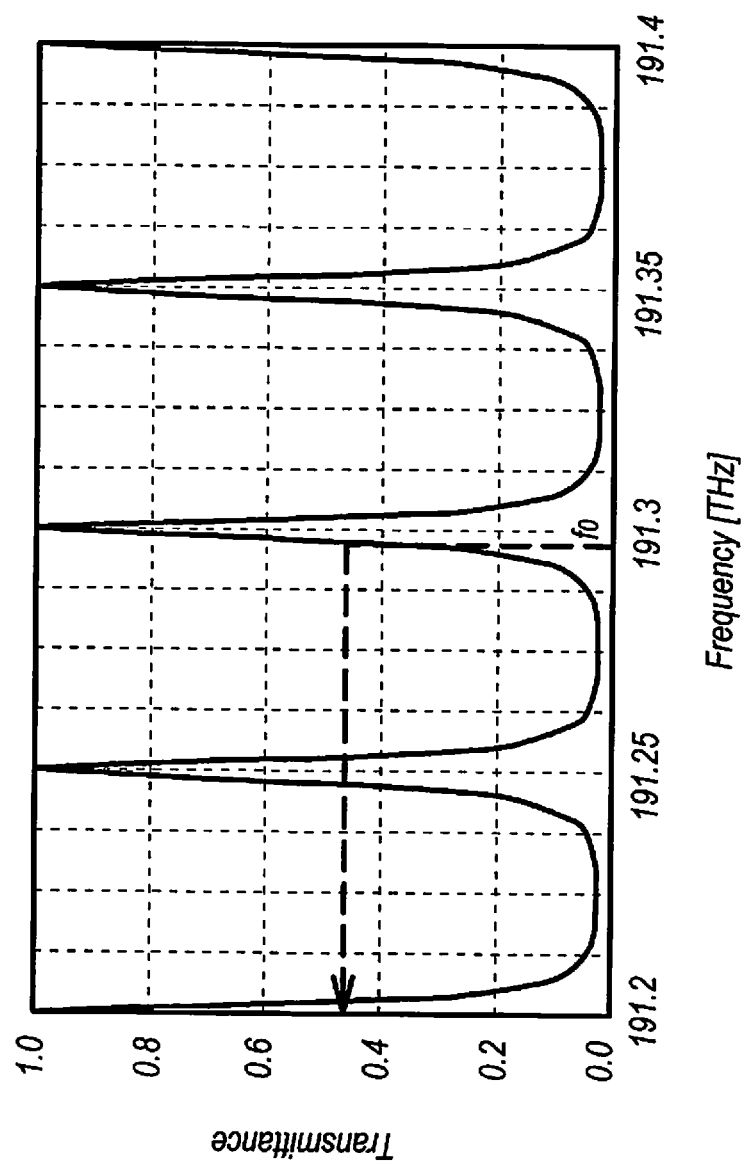
FIG. 11 shows typical transmittance of the ring resonator formed by a waveguide device made of silicon (Si)

FIG. 11 shows typical transmittance of the ring resonator 73 formed by a waveguide device made of silicon (Si). The controller 78, which is a type of temperature controller, may control the temperature of the ring resonator 73 such that the transmittance thereof becomes moderate, namely, around 0.5 at a center frequency of the laser emission of the wavelength tunable LD 30C. Because the light with the polarization perpendicular to the page of FIG. 10, namely, the feedback light by the PROF loop, does not interfere with the light of the laser emission whose polarization is parallel to the page, the returning light causes no influence on the rate equation. Thus, the wavelength tunable LD 30C accompanied with the PROF loop may reduce the frequency fluctuation in the laser oscillation and may stabilize the laser oscillation thereof.

Because the PROF loop includes the ring resonator 73, the PROF loop shows wavelength dependence in the feedback amount thereof. In a condition shown in FIG. 11 where the center frequency $f_0$ exists in a region where the transmittance of the ring resonator 73 increases as the oscillation frequency increases, that is, the center frequency $f_0$ exists in a left side of the transmission peak. Under such a condition of the center frequency $f_0$ and the transmittance of the ring resonator 73, the RPOF loop enhances the loop gain when the center frequency shifts to $f_0+\Delta f$, while, decrease the loop gain when the center frequency shifts to $f_0-\Delta f$. Thus, the fluctuation in the oscillation frequency, namely, the phase noise of the laser emission may be effectively reduced. When the center frequency $f_0$ exists in a right side of a transmittance peak; the relation between the loop gain of the RPOF loop and a shift of the center frequency becomes opposite In the present embodiment, the APC control by the power controller 77 and the ATC control by the temperature controller 78 may maintain the input level and the output level of the laser light input to and output from the ring resonator 73, respectively. Accordingly, the PROF loop may stabilize the loop gain thereof.

Figure 12:
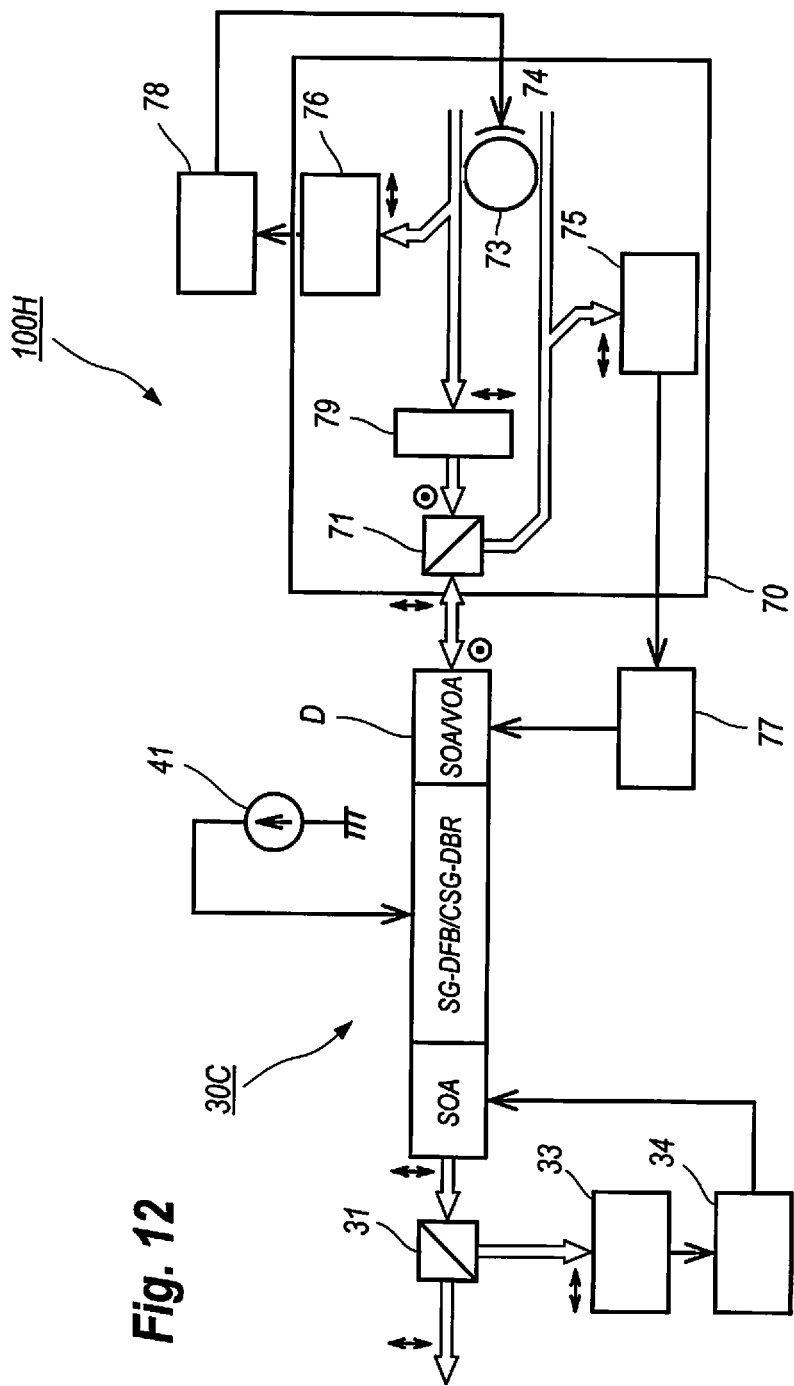
FIG. 12 is a plan view of a functional block diagram of an optical transmitter modified from the optical transmitter shown in FIG. 10.

The polarization rotator 79 of the present embodiment may include a λ/2 or a Farady rotator that rotates the polarization of light transmitting therethrough by 90°. In an alternative, the PBS 71 and the polarization rotator 79 may be monolithically integrated within the Si substrate 70 when the rear facet 17 of the wavelength tunable LD 30C shows reflectance enough low such that substantially no light returns the Si substrate 70, as shown in FIG. 12. This arrangement of the waveguide device on the Si substrate 70 may have only one optical port for inputting and outputting light, which means that the optical transmitter 100H may make the dimensions thereof further smaller.

Tenth Embodiment

Figure 13:
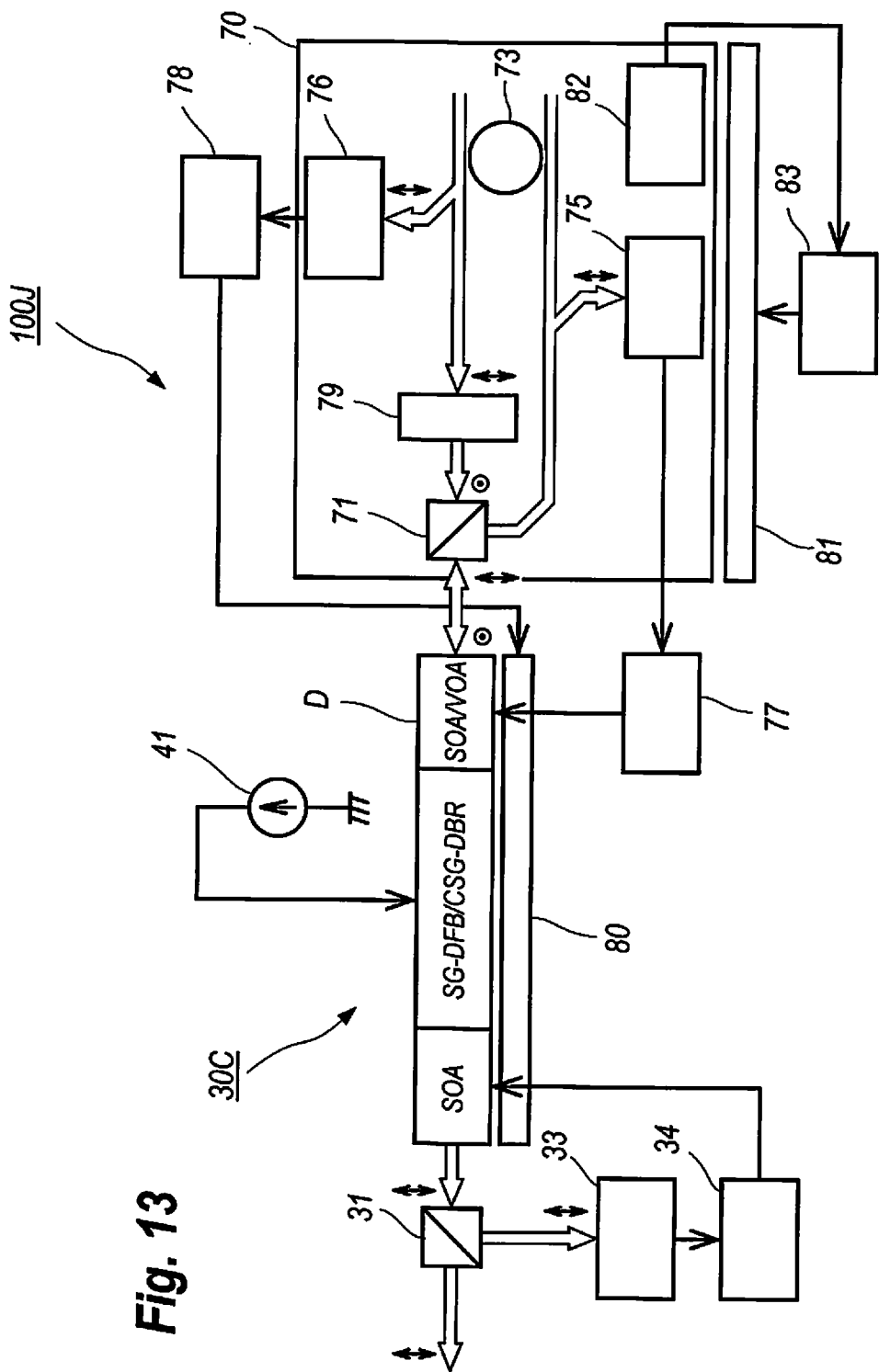
FIG. 13 is a plan view schematically illustrating a functional block diagram of an optical transmitter according to the tenth embodiment of the present invention.

FIG. 13 is a plan view schematically illustrating a functional block diagram of an optical transmitter 100J according to the tenth embodiment of the present invention. The optical transmitter 100J, compared with the arrangement of the optical transmitter 100H shown in FIG. 12, removes the heater 74 but further includes temperature controlling devices (TEC), 80 and 81, a temperature sensor 82, and a temperature controller 83. The temperature controlling device 80, which may be a thermo-electric cooler (TEC), mounts the wavelength tunable LD 30C thereon in order to control a temperature of the wavelength tunable LD 30C. The other TEC 81 mounts the Si substrate 70 in order to control a temperature of the ring resonator 73. The temperature sensor 82 senses the temperature of the ring resonator 73, exactly, the temperature controlled by the TEC 81. The TECs, 80 and 81, may be a type of Peltier Element device.

The temperature controller 83 may control the temperature of the TEC 81 based on an output of the temperature sensor 82. The other controller 78, which is also a type of temperature controller, controls the temperature of the TEC 80 based on the output of the photo-detector 75, which maintains the light output from the ring resonator 73 in a preset power. The optical transmitter 100H of the embodiment maintains the temperature of the TEC 81, namely, that of the ring resonator 73, in a preset temperature, which means the transmittance of the ring resonator 73 is stabilized against the wavelength. That is, peak wavelengths and an interval between peaks are stabilized against the temperature. While, the light output from the ring resonator 73 is kept constant by adjusting the temperature of the TEC 80 through the temperature controller 78. Thus, the optical transmitter 100H may implement a function to enhance the linewidth characteristic of the wavelength tunable LD 30C and to stabilize the emission wavelength, namely, the function of the wavelength locking.

Eleventh Embodiment

Figure 14:
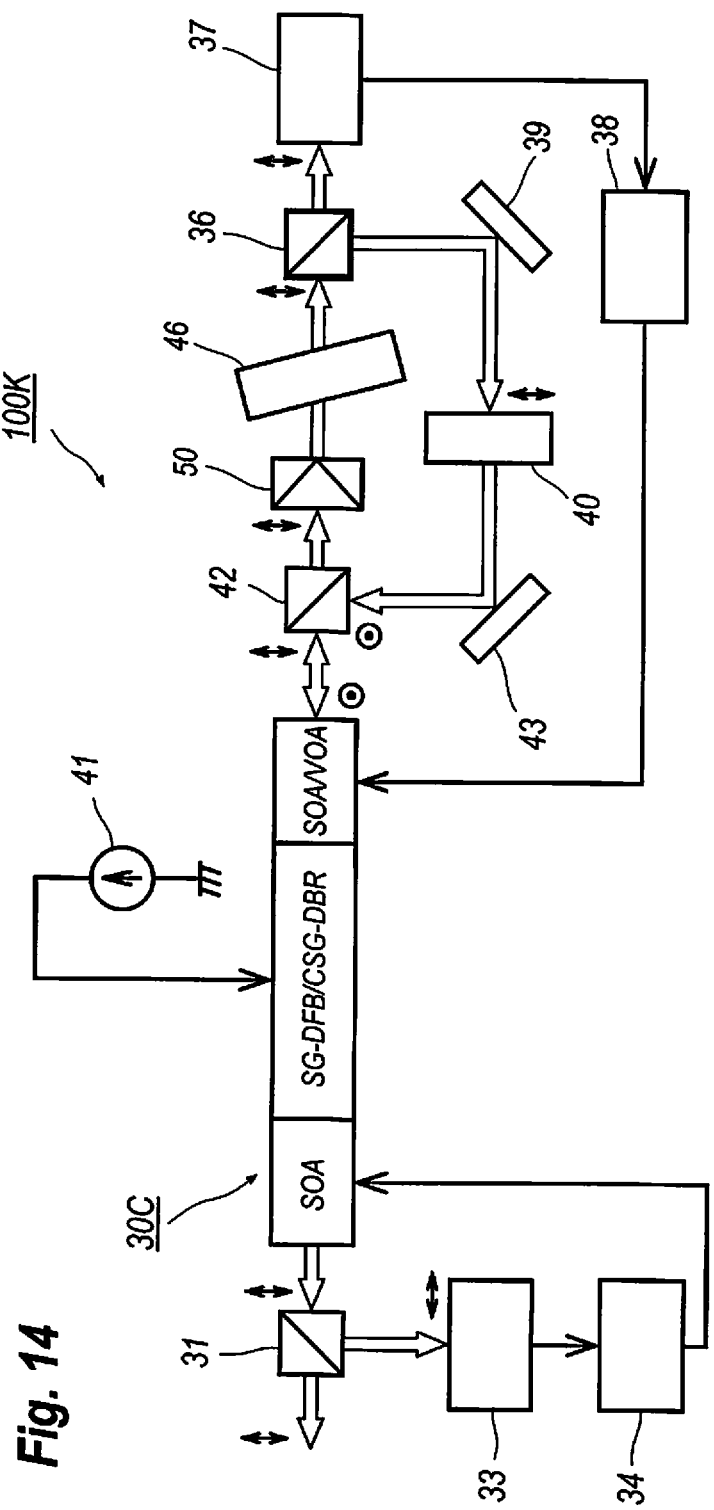
FIG. 14 is a plan view schematically illustrating a functional block diagram of an optical transmitter according to the 11th embodiment of the present invention.

FIG. 14 is a plan view of the optical transmitter according to the eleventh embodiment of the present invention. An optical transmitter 100K shown in FIG. 14, which is modified from the optical transmitter 100A of the second embodiment shown in FIG. 3 and that 100F of the seventh embodiment shown in FIG. 8, has a feature distinguishable from those of the aforementioned embodiment that the feedback unit provides an optical isolator 50 that only passes the portion of the laser light output from the rear facet 17 towards the etalon filter 46, but substantially cuts light coming from the etalon filter 46 toward the PBS 42. The portion of the laser light passing the optical isolator 50 and the etalon filter 46 enters the $\lambda/2$ plate 40 and rotates the polarization thereof by substantial 90°. That is, the polarization of the portion of the laser light entering the $\lambda/2$ plate is parallel to the page of FIG. 14, but the laser light output therefrom has the polarization in perpendicular to the page. Thus, the portion of the laser light output from, the $\lambda/2$ plate 40 re-enters the wavelength tunable LD 30C from the rear facet 17 thereof as the feedback light after reflected at the PBS 42. The portion of the laser light output from the etalon filter 46 may be sensed by the photo-detector 37. The output from the photo-detector 37 is fed back to the SOA in the wavelength tunable LD 30C through the power controller 38 that adjusts the optical gain or the optical loss at the SOA. The arrangement of the feedback unit implemented in the optical transmitter 100K of the eleventh embodiment may also reduce the phase noises inherently contained within the laser light, which is output from the front facet 16 thereof.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An optical transmitter, comprising:
a wavelength tunable laser diode (LD) that emits laser light with a polarization, the wavelength tunable LD having a sampled grating distributed feedback (SG-DFB) region and a chirped sampled grating Bragg reflector (CSG-DBR) region, the SG-DFB region forming a cavity that determines a wavelength of the laser light accompanied with the CSG-DBR region;
a feedback unit that generates feedback light by rotating the polarization of a portion of the laser light by a range of 90±5° and returns the feedback light to the wavelength tunable LD; and
an optical attenuator that attenuates the feedback light, the feedback light reducing frequency noises attributed to the laser light.

2. The optical transmitter of claim 1,
wherein the feedback unit includes the attenuator.

3. The optical transmitter of claim 1,
wherein the wavelength tunable LD integrates a semiconductor optical amplifier as the attenuator.

4. The optical transmitter of claim 1,
wherein the feedback unit includes a half wavelength ($\lambda/2$) plate that rotates the polarization of the portion of the laser light by the range of 90±5° by passing the portion of the laser light once in unidirectional.

5. The optical transmitter of claim 4,
wherein the feedback unit further includes an optical isolator.

6. The optical transmitter of claim 4,
wherein the feedback unit further includes an optical filter that has periodic transmission spectrum.

7. The optical transmitter of claim 1,
wherein the feedback unit includes a quarter wavelength ($\lambda/4$) plate that rotates the polarization of the portion of the laser light by the range of 90±5° by passing the portion of the laser right twice in bidirectional.

8. The optical transmitter of claim 1,
wherein the feedback unit includes a Farady rotator that rotates the polarization of the portion of the laser light by the range of 90±5° by passing the portion of the laser light once.

9. The optical transmitter of claim 1,
wherein the feedback unit includes a Farady rotator that rotates the polarization of the portion of the laser light by the range of 90±5° by passing the portion of the laser light one in unidirectional.

10. The optical transmitter of claim 1,
wherein the feedback unit includes a Farady rotator that rotates the polarization of the portion of the laser light by the range of 90±5° by passing the portion of the laser light twice in bidirectional.

11. The optical transmitter of claim 1,
wherein the feedback unit includes an optical filter having periodic transmittance.

12. The optical transmitter of claim 11,
wherein the optical filter is an etalon filter whose periodic transmission is varied by a temperature thereof.

13. The optical transmitter of claim 11,
wherein the optical filter is a ring resonator whose periodic transmission is varied by a temperature thereof.

14. The optical transmitter of claim 1,
wherein the wavelength tunable LD outputs the portion of the laser light and a rest of the laser light both in one facet thereof.

15. The optical transmitter of claim 1,
wherein the wavelength tunable LD outputs the portion of the laser light and a rest of the laser light in respective facets opposite to each other.

* * * * *

UNITED STATES PATENT AND TRADEMARK OFFICE
CERTIFICATE OF CORRECTION

PATENT NO.         : 9,819,149 B2
APPLICATION NO.    : 15/357620
DATED              : November 14, 2017
INVENTOR(S)        : Katsumi Uesaka et al.

It is certified that error appears in the above-identified patent and that said Letters Patent is hereby corrected as shown below:

On the Title Page

- (73) Assignees: Sumitomo Electrix Industries, Ltd., Osaka-shi (JP) should be -- Sumitomo Electric Industries, Ltd., Osaka-shi (JP) --

Signed and Sealed this
Tenth Day of April, 2018

Andrei Iancu
*Director of the United States Patent and Trademark Office*